US011895928B2

(12) United States Patent
Haq et al.

(10) Patent No.: US 11,895,928 B2
(45) Date of Patent: Feb. 6, 2024

(54) INTEGRATION SCHEME FOR THREE TERMINAL SPIN-ORBIT-TORQUE (SOT) SWITCHING DEVICES

(71) Applicant: Headway Technologies, Inc., Milpitas, CA (US)

(72) Inventors: Jesmin Haq, Milpitas, CA (US); Tom Zhong, Saratoga, CA (US); Luc Thomas, San Jose, CA (US); Zhongjian Teng, Santa Clara, CA (US); Dongna Shen, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 145 days.

(21) Appl. No.: 16/592,210

(22) Filed: Oct. 3, 2019

(65) Prior Publication Data
US 2021/0104663 A1    Apr. 8, 2021

(51) Int. Cl.
*H10N 52/01*    (2023.01)
*G11C 11/16*    (2006.01)
(Continued)

(52) U.S. Cl.
CPC ........... *H10N 52/01* (2023.02); *G11C 11/161* (2013.01); *H10B 61/20* (2023.02); *H10N 50/85* (2023.02);
(Continued)

(58) Field of Classification Search
CPC ......... H01L 43/10; H01L 43/08; H01L 43/12; H01L 43/04; H01L 43/02; H01L 43/14;
(Continued)

(56) References Cited

U.S. PATENT DOCUMENTS

| 8,350,347 B2 | 1/2013 | Gaudin et al. |
| 9,542,987 B2 | 1/2017 | Naik et al. |

(Continued)

FOREIGN PATENT DOCUMENTS

WO    WO 2016/021468    2/2016

OTHER PUBLICATIONS

"Spin Hall Effect," by M. I. Dyakonov, Universite Montpellier II, CNRS, Montpellier, France, Oct. 11, 2012, 12 pages.

(Continued)

*Primary Examiner* — Vongsavanh Sengdara
(74) *Attorney, Agent, or Firm* — Saile Ackerman LLC; Stephen B. Ackerman

(57) ABSTRACT

A three terminal spin-orbit-torque (SOT) device is disclosed wherein a free layer (FL) with a switchable magnetization is formed on a Spin Hall Effect (SHE) layer comprising a Spin Hall Angle (SHA) material. The SHE layer has a first side contacting a first bottom electrode (BE) and an opposite side contacting a second BE where the first and second BE are separated by a dielectric spacer. A first current is applied between the two BE, and the SHE layer generates SOT on the FL thereby switching the FL magnetization to an opposite perpendicular-to-plane direction. The SHE layer is a positive or negative SHA material, and may be a topological insulator such as $Bi_2Sb_3$. A top electrode is formed on an uppermost hard mask in each SOT device. A single etch through the FL and SHE layer ensures a reliable first current pathway that is separate from a read current pathway.

12 Claims, 7 Drawing Sheets

(51) Int. Cl.
*H10B 61/00* (2023.01)
*H10N 50/85* (2023.01)
*H10N 52/00* (2023.01)
*H10N 52/80* (2023.01)
*G11C 11/18* (2006.01)

(52) U.S. Cl.
CPC .............. *H10N 52/00* (2023.02); *H10N 52/80* (2023.02); *G11C 11/18* (2013.01)

(58) Field of Classification Search
CPC ..... H01L 43/06; H01L 27/226; H01L 27/222; G11C 11/161; H10B 61/20; H10B 61/00; H10N 50/01; H10N 50/10; H10N 50/80; H10N 50/85; H10N 52/00; H10N 52/01; H10N 52/80
See application file for complete search history.

(56) References Cited

U.S. PATENT DOCUMENTS

| | | | |
|---|---|---|---|
| 9,929,210 | B2 | 3/2018 | Lai et al. |
| 9,941,468 | B2 | 4/2018 | Fukami et al. |
| 10,157,632 | B1 | 12/2018 | Song et al. |
| 10,193,061 | B2 | 1/2019 | Shiokawa et al. |
| 2008/0074802 | A1* | 3/2008 | Carey .................. B82Y 25/00 360/324.1 |
| 2015/0348606 | A1 | 12/2015 | Buhrman et al. |
| 2016/0247550 | A1* | 8/2016 | Fukami ............... G11C 11/1675 |
| 2017/0125078 | A1* | 5/2017 | Mihajlovic ............. G11C 11/18 |
| 2018/0337326 | A1* | 11/2018 | Sasaki .................. G11C 11/18 |
| 2019/0074124 | A1* | 3/2019 | Ishitani .................. H10N 50/10 |
| 2020/0075073 | A1* | 3/2020 | Sasaki .................. G11C 11/161 |
| 2020/0105324 | A1* | 4/2020 | Smith ................... H10B 61/22 |
| 2021/0083175 | A1* | 3/2021 | Suda ...................... H10B 61/00 |

OTHER PUBLICATIONS

"Surface-Assisted Spin Hall Effect in Au Films with Pt Impurities," by B. Gu et al., Physical Review Letters, PRL 105, 216401 (2010), Nov. 19, 2010, 2010 The American Physical Society, pp. 1-4.

"Spin-Torque Ferromagnetic Resonance Induced by the Spin Hall Effect," by Luqiao Liu et al., Physical Review Letters, PRL 106, 036601 (2010), Jan. 21, 2011, 2011 American Physical Society pp. 1-4.

"Researchers achieve significant breakthrough in topological insulator-based devices for mondern spintronic applications," by National University of Singapore, Nov. 28, 2017, 3 pgs, found Jun. 12, 2019: https://phys.org/news/2017-11-significant-breakthrough-topological-insulator-based-devices.html#jCp.

"Area-Efficient SOT-MRAM With a Schottky Diode," by Yeongkyo Seo et al., IEEE Electron Device Letters, vol. 37, No. 8, Aug. 2016, pp. 982-985.

"Spin injection and detection in magnetic nanostructures," by S. Takahashi et al, Physical Review B 67, 052409 (2003), Feb. 28, 2003, pp. 1-4.

Spin-Torque Switching with the Giant Spin Hall Effect of Tantalum, by Luqiao Liu et al., Science, vol. 336, May 4, 2012, pp. 555-558, www.sciencemag.org.

"Magnetization switching by spin-orbit torque in an antiferromagnet-ferromagnet bilayer system," by Shunsuke Fukami et al., Published online: Feb. 15, 2016, Nature Materials, vol. 15, May 2016, www.nature.com/naturematerials, 2016 Macmillan Publishers Limited, pp. 535-542.

"Thermally activated switching of perpendicular magnet by spin-orbit spin torque," by kI-Seung lee et al., Appl. Phys. Lett. 104, 072413 (2014): https://doi/org/10.1063/.14866186, Published Online: Feb. 21, 2014, pp. 1-5.

"Threshold current for switching of a perpendicular magnetic layer induced by spin Hall effect," by Ki-Seung Lee et al., Appl. Phys. Lett. 102, 112410 (2013): https://doi.org/10.1063/1.4798288, Published Online: Mar. 20, 2013, pp. 1-5.

"Current-Induced Switching of Perpendicularly Magnetized Magnetic Layers Using Spin Torque from the Spin Hall Effect," aby Luqiao Liu et al., Physical Review Letters, PRL 109, 096602 (2012), Aug. 31, 2012, 2012 American Physical Society, pp. 1-5.

"A spin-orbit torque switching scheme with collinear magnetic easy axis and current configuration," by S. Fukami et al., Published online: Mar. 21, 2016, Nature Nanotechnology, vol. 11, www.nature.com/naturenanotechnology, Jul. 2, 2016 2016, Macmillan Publishers Limited, pp. 621-626.

"Switching of perpendicular magnetization by spin-orbit torques in the absence of external magnetic fields," by Guoqiang Yu et al., Published online: May 11, 2014, Nature Nanotechnology, vol. 9, Jul. 2014, www.nature.com/naturenanotechnology, 2014 Macmillan Publishers Limited, pp. 548-554.

"Perpendicular switching of a single ferromagnetic layer induced by in-plane current injection," by Ioan Mihai Miron et al., Aug. 11, 2011, Nature, vol. 476, 2011 Macmillan Publishers Limited, pp. 189-194.

"Observation of the Spin Hall Effect in Semiconductors," by Y. K. Kato et al., Dec. 10, 2004, vol. 306, Science, www.sciencemag.org, pp. 1910-1913.

* cited by examiner

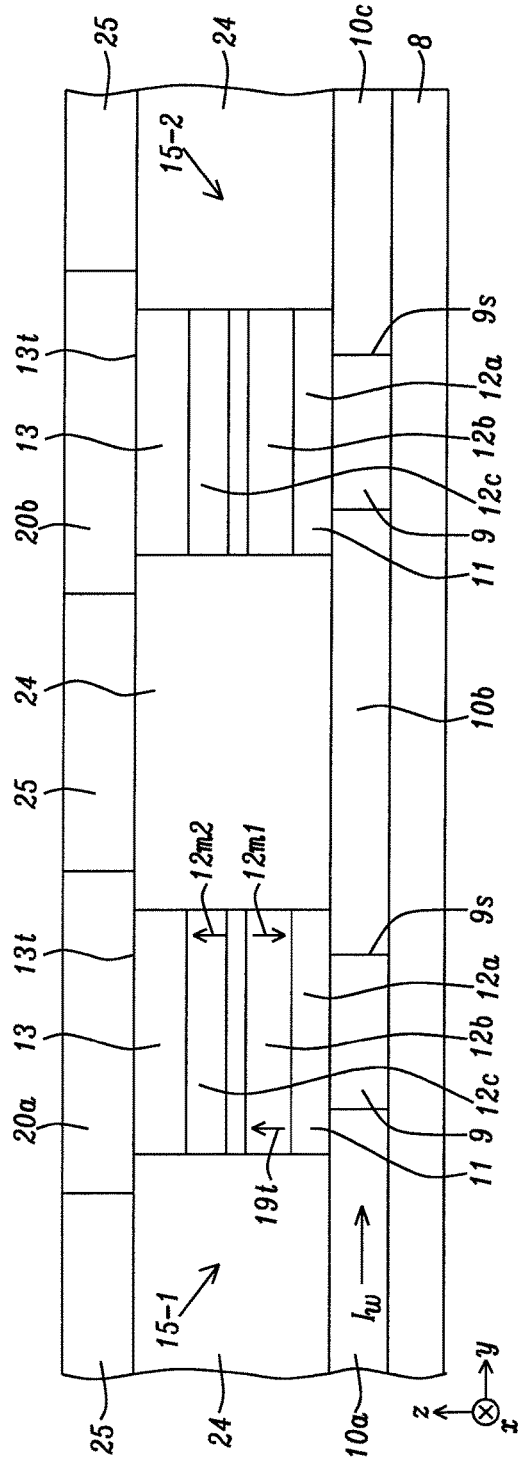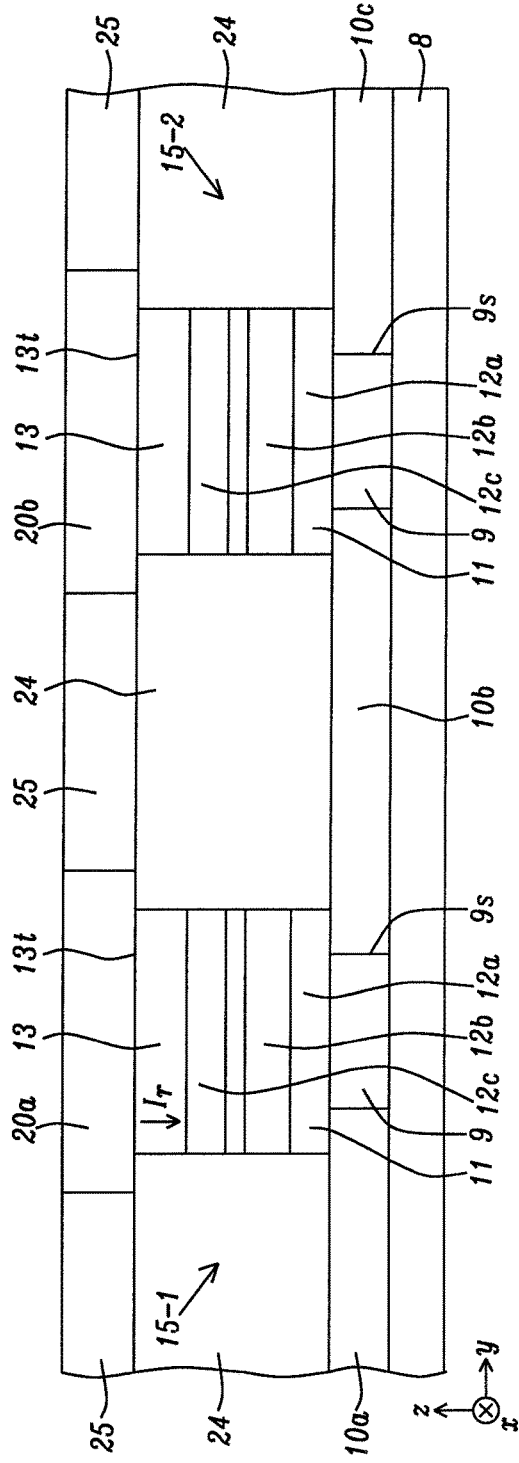
FIG. 17
FIG. 18

INTEGRATION SCHEME FOR THREE TERMINAL SPIN-ORBIT-TORQUE (SOT) SWITCHING DEVICES

RELATED PATENT APPLICATION

This application is related to the following: U.S. Patent Publication 2019/0074124; which is herein incorporated by reference in its entirety.

TECHNICAL FIELD

The present disclosure relates to an integration scheme for a three terminal SOT switching device wherein a thin heavy metal layer generates a Spin Hall Effect involving spin orbit torque on an adjoining ferromagnetic (FM) layer thereby switching the FM magnetization, and in particular, to a one step etch process that forms a sidewall on the FM layer and heavy metal layer without overetching the heavy metal to enable a more reliable and less complex fabrication process.

BACKGROUND

A variety of random access memory (RAM) devices including dynamic (DRAM), static (SRAM), and magnetoresistive (MRAM) versions, and flash memory exist in the current memory market. Among the possible candidates, MRAM technology provides a good combination of fast access time, non-volatility, data retention, and endurance (reliability). A promising universal MRAM technology is the two terminal Magnetic Tunnel Junction (MTJ) based on Spin-Transfer Torque (STT) switching that is often referred to as STT-MRAM. The MTJ is a nanostructure comprised of two FM layers such as CoFeB that are separated by a thin insulator layer (i.e. MgO), which represents the tunnel barrier. One of the FM layers is the reference layer (RL) with a fixed magnetization, and the other FM layer is the free layer having a magnetization that can be switched to be either parallel or anti-parallel to the RL magnetization. However, two main shortcomings are still limiting the reliability and endurance of STT-MRAM. First, the high current density required for writing can occasionally damage the MTJ tunnel barrier. Secondly, there is a challenge to fulfill a reliable reading without inadvertently causing the free layer magnetization to switch since writing and reading operations share the same path through the MTJ.

To overcome the limitations associated with state of the art STT-MRAMs, three terminal SOT switching devices that are based on independent reading and writing paths are emerging. During writing, a spin current is generated in a non-magnetic layer through a bulk Spin Hall Effect as well as with an interfacial Rashba effect wherein spin-orbit coupling causes electrons with different spins to deflect in different directions yielding a pure spin transverse to an applied charge current.

Spin Hall Effect (SHE) is a physics phenomenon discovered in the mid $20^{th}$ century, and is described by M. Dyaknov et al. in Physics Lett. A, Vol. 35, 459 (1971). Similar to a regular Hall Effect where conduction carriers with opposite charges are scattered to opposite directions perpendicular to the current density due to a certain scattering mechanism, SHE causes electrons with opposite spins to be scattered to opposite directions perpendicular to the charge current density as a result of strong spin-orbit coupling in the conducting layer. As shown in FIG. 1, electrons pass through a non-magnetic conductor 2w with strong spin orbit interaction, and electrons 3a with spin in the negative x-axis direction are deflected to the +z-axis surface 2-1 while electrons 3b with spin in the positive x-axis direction are deflected to the negative z-axis surface 2-2. SHE is quantified by the Spin Hall Angle (SHA) that is defined as the ratio of the spin current in the direction transverse to the charge current (z-axis in FIG. 1) to the charge current (y-axis direction in FIG. 1). For many years after SHE was discovered, the absolute value of SHA materials evaluated was typically <0.01, and SHE had very limited applications in industry.

During the past 10 years, materials with substantially larger (giant) SHA have been found. B. Gu et al. in Phys. Rev. Lett. 105, 216401 (2010), and L. Liu et al. in Phys. Rev. Lett. 106, 036601 (2011) provided examples of SHA~0.07 in a Pt layer, and as large as 0.12 in a Au layer with Pt doping, and an application where giant transverse spin current is injected into an adjacent magnetic layer to induce magnetization reversal and ferromagnetic resonance by spin torque. A large but negative SHA of around −0.12 was found in β-Ta, meaning that electrons in the β-Ta layer are spin scattered in the opposite directions compared to what is shown in FIG. 1. A SHE layer comprised of the negative SHA material was also used to interact with an adjacent magnetic layer, and even flip a magnetization in a magnetic layer in a magnetic random access memory (MRAM) device without sending a current through the MTJ. The aforementioned applications using SHE, or spin orbit torque (SOT) in MRAM applications, are typically called SOT-MRAM, and can significantly reduce the reliability concern that is generally found in conventional spin torque transfer (STT-MRAM) technology.

Different heavy metal/FM bilayers have been proposed as the source of spin orbit torque to switch the FM layer magnetization. Heavy metals including Ta, Hf, Pt, Ir, and W are promising candidates. Thus, current applied to a heavy metal layer that is preferably comprised of a giant SHA material generates sufficient SOT that acts on the adjacent FM layer through spin-orbit interactions to enable efficient FM magnetization switching. Furthermore, a report at https://phys.org/news/2017-11-significant-breakthrough-to-pological-insulator-based-devices.html#Cp indicates an extremely low current density may drive giant SOT for switching the FM layer in a topological insulator/FM heterostructure such as $(Bi_2Sb_3)$/NiFe. These results show that topological insulator (TI) based SOT-MRAM may be a substantial improvement over its heavy metal based counterparts in SOT applications.

A major challenge in the integration scheme for three terminal SOT switching devices is to pattern the very thin heavy metal layer that is typically less than 12 nm thick in order to generate sufficient SOT to effectively switch the overlying FM layer. Typically, a photolithography and etch sequence is used to form a pattern comprised of a plurality of island shapes in the heavy metal layer on a bottom electrode array. Then, the FM layer is deposited and patterned with a second photolithography and etch sequence that involves an overlying hard mask (HM). Unfortunately, the heavy metal (SHE) layer is thin and there is a lack of process control to etch stop within the SHE layer after the FM layer etch is complete. Moreover, an over etch of the FM layer is usually required to guarantee the removal of all FM material between SOT-MRAM cells. During the over etch, the sides of the SHE layer in the SOT-MRAM cell (nanopillar) tend to erode such that contact is lost with the underlying bottom electrode, which renders the device unusable. Therefore, an improved integration scheme is needed where formation of the SOT-MRAM nanopillars with a heavy metal/FM stack or a TI/FM stack on a bottom electrode provides structural integrity so that device reliability is improved. Ideally, the new process flow should involve fewer steps than found in current integration schemes to enable better reproducibility and lower cost.

SUMMARY

One objective of the present disclosure is to provide a SOT-MRAM integration scheme that provides structural integrity in the heavy metal/FM layer stack or TI/FM layer stack so that acceptable device reliability is achieved.

A second objective of the present disclosure is to provide the SOT-MRAM integration scheme of the first objective that requires fewer process steps than in prior art integration schemes so that process complexity and cost are reduced.

A third objective of the present disclosure is to provide a SOT-MRAM structure that is compatible with the improved SOT-MRAM integration scheme of the present disclosure.

According to a first embodiment of the present disclosure, a three terminal SOT switching device is provided and comprises a plurality of bottom electrodes (BE) where adjacent BE are separated by a dielectric spacer having a dimension (w) in a device width direction. A SHE layer is formed on each dielectric spacer such that a first end of the SHE layer contacts a top surface of a first BE and a second end of the SHE layer contacts a top surface of a second BE to effectively form a conductive bridge between the adjacent first and second BE. The SHE layer may be comprised of a heavy metal such as Ta, Hf, Pt, Ir, and W, or may be a topological insulator (TI) that is $Bi_2Sb_3$, $Bi_2Se_3$, $Bi_2Te_3$, or $Sb_2Te_3$, for example. According to a first embodiment, a FM (free) layer is formed on each SHE layer and has a sidewall that is coplanar with the SHE layer sidewall, and the width (w3) of each FM layer is greater than w. In some embodiments, a tunnel barrier, reference layer, and a hard mask are sequentially formed on the FM layer in each device and have a width substantially equal to w3. A top electrode is formed on each HM. The top electrode layer comprises a plurality of conductive lines that are aligned orthogonal to the lengthwise direction of the bottom electrodes. When a first current is applied from the first BE through the SHE layer to the second BE during a write operation, the SHE layer produces a spin-orbit torque on the FM layer that switches a FM magnetization that is aligned orthogonal to the SHE layer top surface. A read operation occurs when a second current is applied through the SOT-MRAM between the top electrode and one of the first and second BE.

In a second embodiment, the FM layer has a width w4 less than the width of the dielectric spacer. Although the FM layer sidewall is coplanar with the hard mask sidewall, the SHE layer has a sloped sidewall such that a top surface of the SHE layer has width w4 but the bottom surface thereof has a width greater than the width of the dielectric spacer. As a result, a lower end of the sloped sidewall contacts the first BE top surface, and a second lower end of the sloped sidewall on the opposite side of the SHE layer adjoins the second BE top surface to provide a conductive bridge from the first BE to the second BE over the dielectric spacer.

A key feature of the integration scheme is forming a sidewall on both of the FM layer and SHE layer during a single etch process. Thus, after forming a hard mask (HM) with sidewalls and the desired widthwise (w3) and lengthwise (d) dimensions, an ion beam etch (IBE) is performed that removes exposed portions of underlying layers and generates a FM sidewall that is coplanar with the HM sidewall. The IBE continues through the SHE layer and stops on a top surface of the first and second BE thereby forming SHE layer sidewalls that are coplanar with the FM and HM sidewalls. Depending on the etch conditions and FM layer thickness, the sides of the resulting SOT-MRAM cell are substantially vertical and typically have an angle between 70 degrees and 90 degrees with respect to each BE layer such that a top surface of the HM has a smaller width than the SHE layer. Thereafter, an encapsulation layer is deposited to fill the openings between adjacent SOT-MRAM cells. A chemical mechanical polish (CMP) process may be employed to form an encapsulation layer top surface that is coplanar with a HM top surface on each SOT-MRAM cell before a top electrode layer is formed.

In an alternative embodiment, the IBE process is modified after forming the FM sidewalls and FM layer width w4. For example, a lower power is used to form the SHE layer sidewalls, or the ion beam angle may be adjusted from essentially vertical to an angle substantially less than 90 degrees. As a result, a SHE layer sidewall is formed with a foot profile at an angle δ that is preferably from 20 degrees to 70 degrees with respect to each BE layer top surface. Thus, the SHE layer has a bottom surface having a width>w4 and greater than the dielectric spacer width to effectively form a bridge between the first and second BE.

BRIEF DESCRIPTION OF THE DRAWINGS

FIG. 17 shows a write current pathway through a SHE layer and between adjacent bottom electrodes, and FIG. 18 depicts a read current pathway through a SOT-MRAM cell in the array depicted in FIG. 16, and where the SHE layer is made of a positive SHA material.

DETAILED DESCRIPTION

The present disclosure is a three terminal SOT switching device also known as a SOT-MRAM wherein a SHE layer is formed on a dielectric spacer that separates two bottom electrodes, and spin orbit torque that is generated by sending a current through the SHE layer from one side to the opposite side causes a magnetization in an overlying FM layer to switch. The lengthwise and widthwise dimensions of the layers are laid out in the x-axis and y-axis directions, respectively, and a thickness of each SOT-MRAM layer is in the z-axis direction. The present disclosure also encompasses an integration scheme whereby the SOT-MRAM stack comprising the FM layer and SHE layer is formed reliably and with fewer process steps than prior art schemes. The terms "spin orbit torque" and "transverse spin transfer torque" may be used interchangeably.

Figure 1:
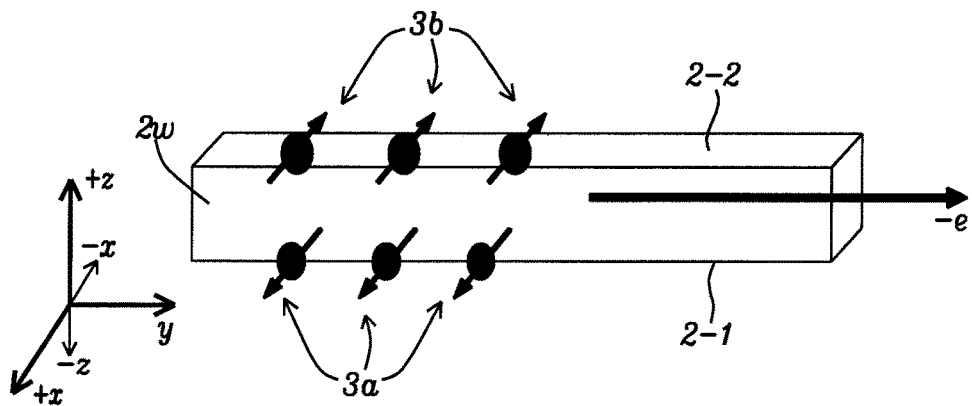
FIG. 1 is an oblique view of a conductor layer made of a Spin Hall Effect material where electrons with spin in the (−) x-axis direction are deflected to the (+) z-axis surface, and electrons with spin in the (+) x-axis direction are deflected to the (−) z-axis surface.
Figure 2:
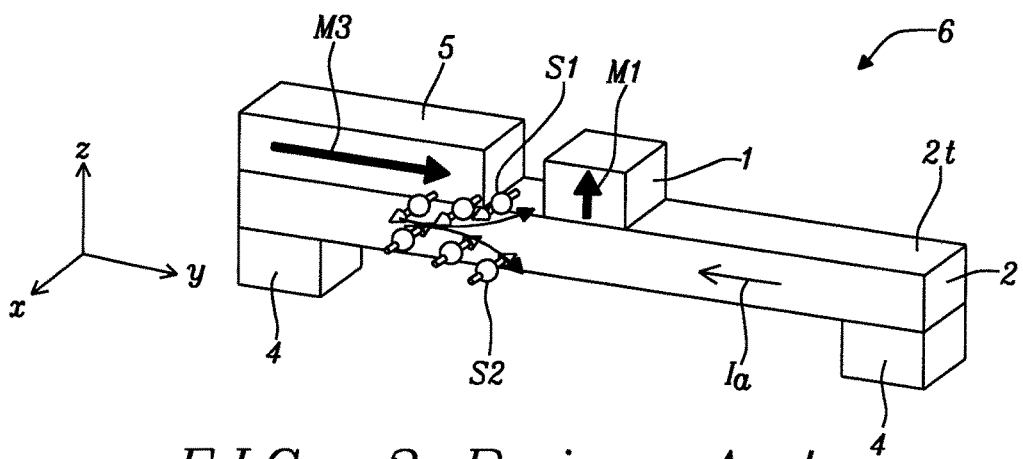
FIG. 2 is an oblique view of a prior art three terminal SOT switching device where current in a bottom electrode comprised of a SHE material generates spin orbit torque on an adjoining FM layer to switch a magnetization therein when a magnetic field is applied transverse to the FM magnetization.

FIG. 2 depicts a SOT-MRAM scheme 6 in related US Patent Publication 2019/0074124 where spin-orbit torque wiring 2 containing a heavy metal that produces a Spin Hall Effect adjoins a bottom surface of FM layer 1 having magnetization M1 in a perpendicular-to-plane direction. When current $I_a$ between vias 4 flows through SOT wiring 2 in the negative y-axis direction (right to left), electrons with spin S1 that is oriented in a positive x-axis direction are deflected to top surface 2$t$ while electrons with spin S2 that is oriented in a negative x-axis direction are deflected to bottom surface 2$b$. Thus, electrons with spin S1 are injected into the FM layer and produce a spin-orbit torque that rotates magnetization M1 by 90 degrees to the y-axis direction. A rotational assist may be applied with magnetization M3 in the y-axis direction in magnetic field applying layer 5.

Figure 3:
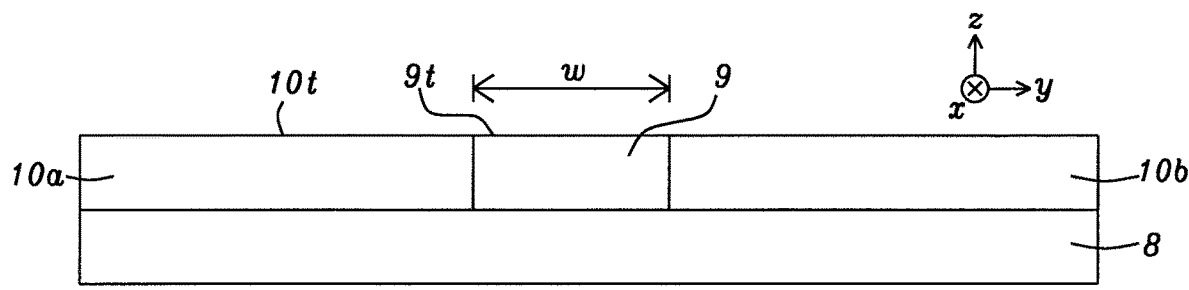
FIG. 3 is cross-sectional view showing a first step in fabricating a three terminal SOT switching device where a dielectric spacer is formed between adjacent bottom electrodes on a substrate according to an embodiment of the present disclosure.

FIGS. 3-6 depict a process flow for fabricating a SOT-MRAM having a SHE layer 11, first FM (free) layer 12a, tunnel barrier 12b, reference layer 12c, and hard mask 13 sequentially formed on a dielectric layer (spacer) 9 that separates two bottom electrodes (BE) 10a, 10b according to a process of record (POR) known to the inventors. In FIG. 3, dielectric layer 9 having width w is formed between BE 10a, 10b and on substrate 8 using a conventional method such that dielectric layer top surface 9$t$ is coplanar with top surfaces 10$t$ of the BE. The substrate may contain a substructure (not shown) that includes transistors and wiring for selectively providing a current to one or more of a plurality of BE in the BE layer, which includes BE 10a, 10b.

Figure 4:
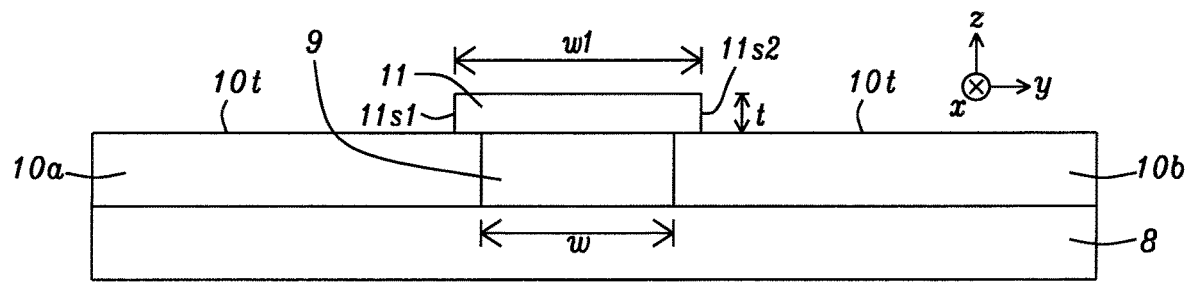
FIGS. 4-5 are cross-sectional views depicting a process of record (POR) sequence known to the inventors where a heavy metal (SHE) layer is deposited and patterned on the dielectric spacer in FIG. 3 before a FM layer is deposited and patterned on the heavy metal layer.

FIG. 4 shows the partially formed SOT-MRAM after SHE layer 11 is deposited on BE 10a, 10b and on dielectric layer 9 and is patterned with a conventional photolithography and etch sequence to yield a SHE layer having width w1 where w1>w, and thickness t such that a first side 11s1 thereof contacts top surface 10$t$ on BE 10a and a second side 11s2 contacts top surface 10$t$ on BE 10b. The SHE layer may be comprised of a positive or negative SHA material, and is preferably a heavy metal that is one of Ta, Hf, Pt, Ir, and W, or a topological insulator (TI) that is $Bi_2Sb_3$, $Bi_2Se_3$, $Bi_2Te_3$, or $Sb_2Te_3$. Preferably, t is less than 12 nm. A TI has an inner portion that is an insulator or a high resistance material while an outer portion comprising the surface thereof has a spin-polarized metal state. Therefore, the TI has an internal magnetic field such as a spin orbit interaction. A pure spin current can be generated in a highly efficient manner due to the strong spin orbit interaction and collapse of the rotational symmetry at the surface.

Figure 5:
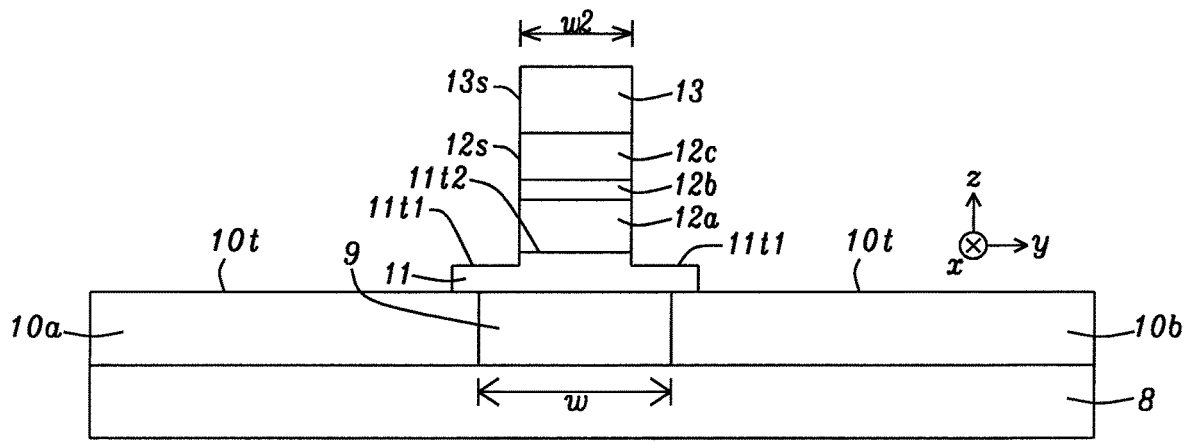

In FIG. 5, the partially formed SOT-MRAM is illustrated after sequential deposition of free layer 12a, tunnel barrier 12b, reference layer 12c, and hard mask (HM) 13. There may be an optional non-magnetic capping layer (not shown) between the reference layer (RL) and HM. Each of the free layer and reference layer is preferably one or more of Co, Fe, Ni, or alloys thereof with B, or laminates thereof including $(Co/Ni)_n$, $(CoFe/Ni)_n$, or laminates with Pt or Pd that are $(Fe/Pt)_n$, $(Co/Pt)_n$, $(Fe/Pd)_n$, and $(Co/Pd)_n$ where n is a lamination number. The tunnel barrier is preferably comprised of a metal oxide such as MgO, or is a metal oxynitride. The hard mask (HM) may be a metal nitride such as TaN, TiN, or is one or more of Ru and Ta. The free layer (FL), tunnel barrier, RL, and HM are then patterned with another photolithography and etch sequence to yield sidewall 12$s$ on the FL, RL and tunnel barrier layer, and HM sidewall 13$s$, and wherein each of the resulting SOT-MRAM stack of layers has width substantially equal to w2 where w2<w. Ideally, the etch stops within SHE layer 11 such the etched portions of SHE layer with top surface 11$t$1 have a lesser thickness than the unetched portion below SHE layer top surface 11$t$2.

Figure 6:
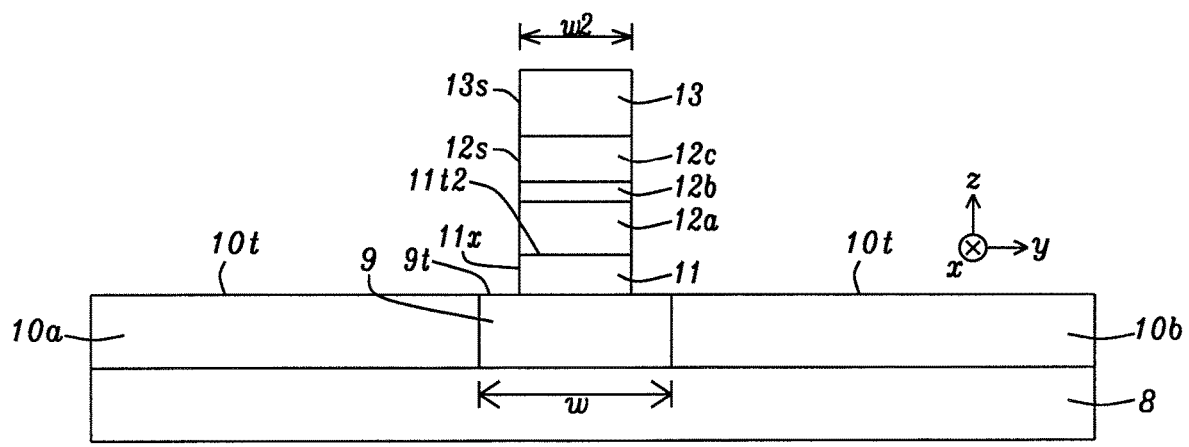
FIG. 6 is a down-track cross-sectional view showing a failure mechanism in the POR sequence where over etching the FM layer causes erosion of the heavy metal layer such that the latter fails to make contact with the bottom electrodes.

Referring to FIG. 6, the etch process that forms sidewall 12$s$ is not controllably stopped within SHE layer 11 in part because of FM thickness variations across the substrate, and varying spacing between adjacent SOT-MRAMs that results in different etch rates as a function of device density. Generally, an over etch step is required to guarantee that all unprotected regions of the free layer are removed between adjacent SOT-MRAM cells. The over etch tends to erode the remaining SHE layer on BE top surface 10$t$ and form SHE layer sidewalls 11$x$ that contact spacer top surface 9$t$ so that the final device width is w2 throughout the SHE layer. As a result, the SHE layer no longer makes contact with BE 10a, 10b and a current cannot be applied across the SHE layer to generate a spin-orbit torque (SOT) on FL 12a when desired. Thus, the SOT-MRAM device is rendered unusable.

Figure 7:
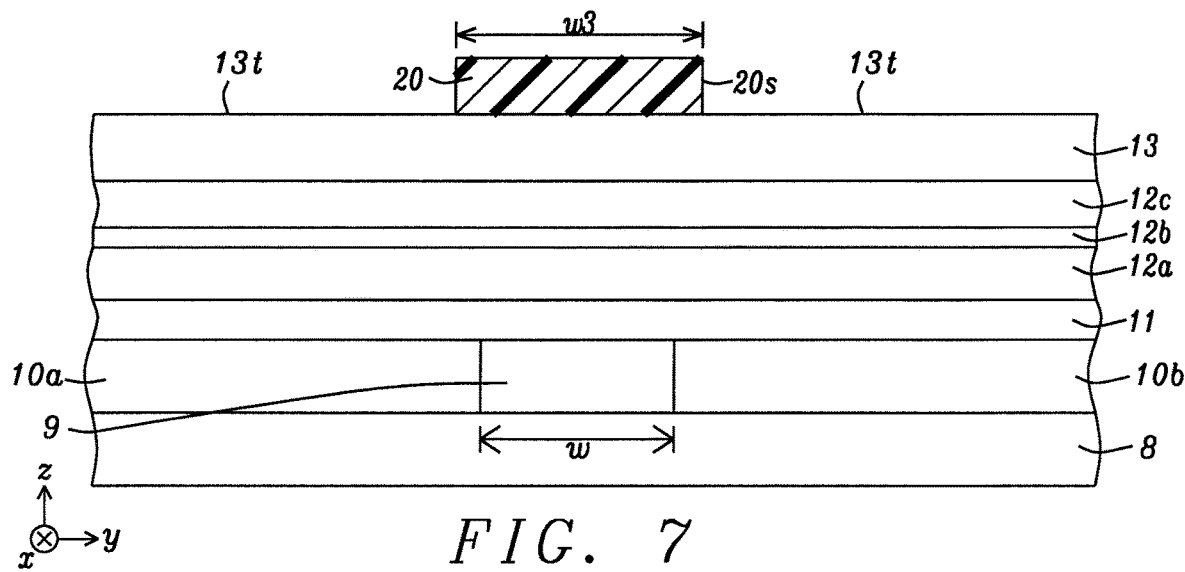
FIGS. 7-9 are cross-sectional views showing a sequence in forming a three terminal SOT switching device where a SHE layer/FM layer stack is etched in a single step and has a device width greater than the width of the underlying dielectric spacer according to a first embodiment of the present disclosure.
Figure 8:
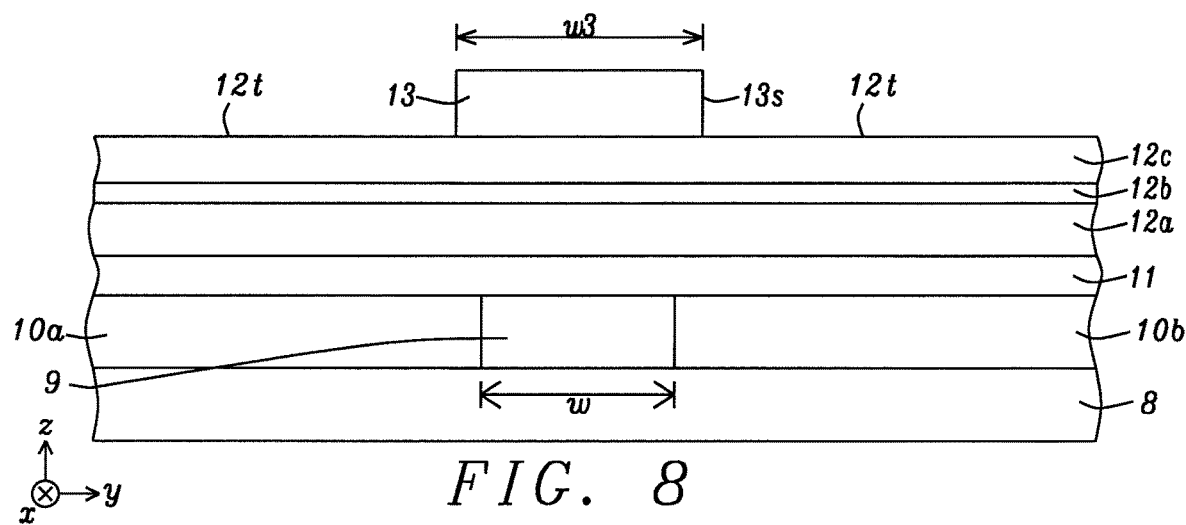
Figure 9:
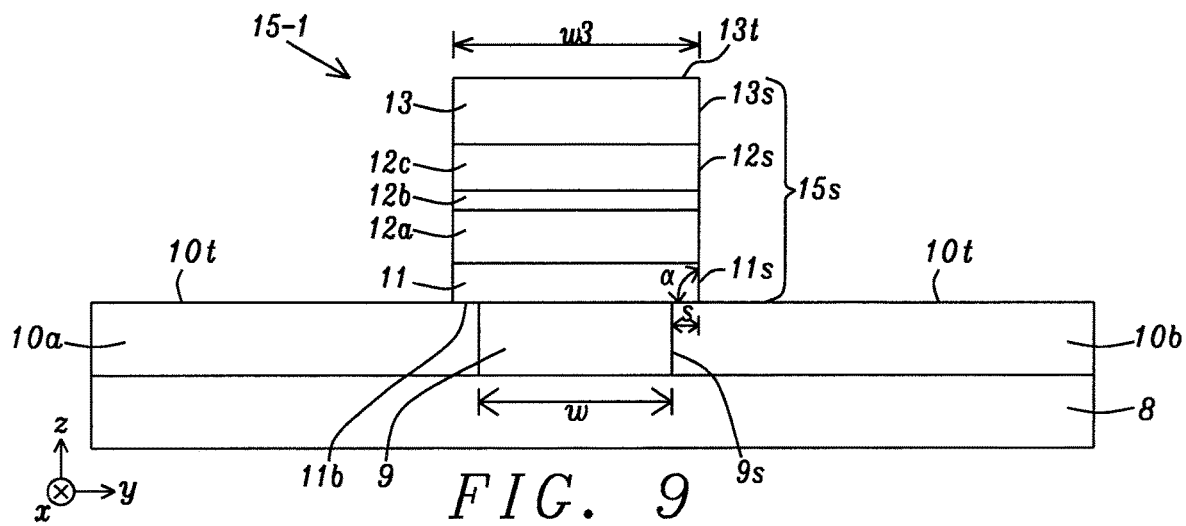

Referring to FIGS. 7-9, a process flow is provided for forming a SOT-MRAM cell 15-1 (FIG. 9) comprised of a SHE layer/FL/tunnel barrier/RL/HM stack having a width w3 where w3>w and w is a width of 30 nm to 300 nm for the dielectric layer 9. An optional capping layer (not shown) may be formed between the RL and HM. In FIG. 7, SHE layer 11, FL 12a, tunnel barrier 12b, RL 12c, and HM 13 are sequentially deposited on BE 10a, 10b and on dielectric layer 9. A photoresist layer is coated on HM top surface 13$t$ and is then patternwise exposed and developed with a well known photolithography process to yield a plurality of photoresist masks 20 each having width w3, and sidewall 20$s$, and where each photoresist mask in the resulting photoresist pattern (not shown) is aligned above a dielectric layer. In some embodiments, a dielectric anti-reflective coating (DARC) or bottom anti-reflective coating (BARC)

used in the art may be deposited on the HM before the photoresist is coated and processed to assist with the imaging step in the photolithography process. The photoresist mask has an island shape that may be a rectangle, oval, or square from a top-down view (not shown). It should be understood that a plurality of photoresist masks are formed in an array of rows and columns in the photoresist pattern but only one shape is shown in the exemplary embodiment.

Referring to FIG. 8, the photoresist mask pattern is transferred through HM 13 (and the DARC or BARC when present) with an ion beam etch (IBE) based on an inert gas that is one of Ar, Kr, Ne, and Xe, or by using a reactive ion etch (RIE) that comprises a chlorocarbon or fluorocarbon gas. Optionally, oxygen may be included in the IBE or RIE. Any remaining photoresist mask that is not removed during the IBE or RIE is stripped with a conventional method. As a result, the HM has sides 13s and a width w3.

Referring to FIG. 9, a key feature of the present disclosure is a second IBE or RIE that is employed to transfer the HM pattern through FL 12c, tunnel barrier 12b, FL 12a, and SHE layer 11 during a single step, and stops on BE top surface 10t. In a preferred embodiment, the second RIE comprises an inert gas and an oxidant such as a combination of Ar and methanol, for example, to minimize etch residue and sidewall damage. Although the second IBE or RIE may include an over etch, there is no issue with removing an upper portion of BE 10a, 10b adjacent to SOT-MRAM side 15s since the BE layer is relatively thick, and SHE layer bottom surface 11b continues to contact the BE top surface. In other words, there may be a certain amount of thickness loss at BE top surface 10t but with no risk to compromising device performance. Accordingly, SOT-MRAM side 15s is formed and includes FL side 12s and SHE layer side 11s that are coplanar with HM side 13s. Side 15s forms an angle α with respect to BE top surface 10t where α is generally between 70° and 90° depending on the RIE or IBE conditions. Preferably, there is an overlap of widths of at least 5 nm to 10 nm of the SHE layer on each of BE 10a and BE 10b such that each SHE layer side 11s is a distance of at least s from side 9s of the dielectric layer 9, and is coplanar with a FL side 12s.

Figure 13:
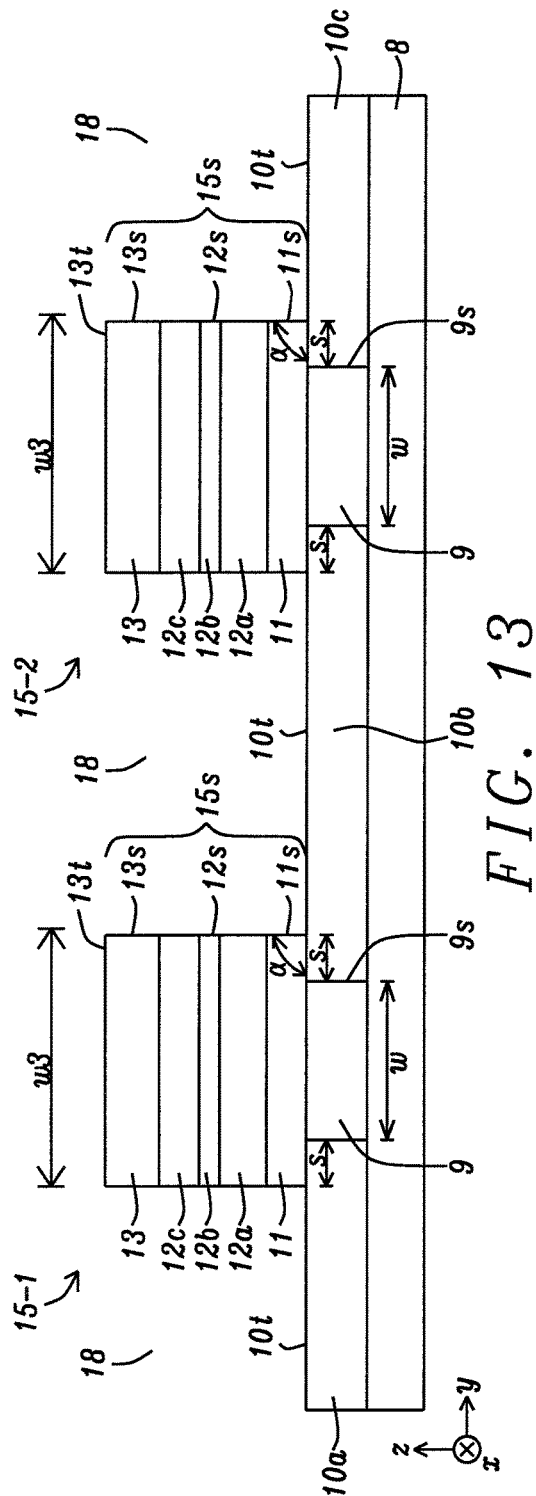
FIG. 13 is a cross-sectional view of two adjacent SOT-MRAMs in an array that is formed on a bottom electrode layer where adjacent bottom electrodes are separated by a dielectric spacer according to an embodiment described herein.

FIG. 13 shows a second SOT-MRAM cell 15-2 formed adjacent to cell 15-1 described previously. Cell 15-2 comprises the same stack of layers as in cell 15-1 but forms a bridge over dielectric layer 9 that is between BE 10b and BE 10c. Thus, side 11s of SHE layer 11 in cell 15-2 is formed a distances from each side 9s in the underlying dielectric layer 9, which means SHE layer 11 contacts a portion of each of BE 10b and BE 10c to provide an electrical pathway for a switching operation.

Figure 14:
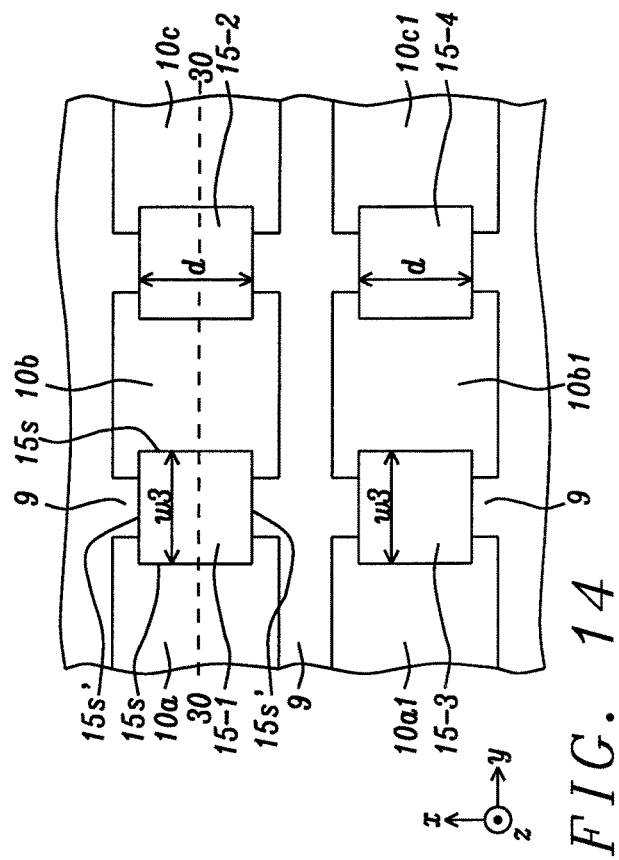
FIG. 14 is a top-down view of the SOT-MRAM array in FIG. 13 that shows a portion of two rows and two columns of SOT-MRAM cells in the array.

In FIG. 14, a top-down view is shown of four cells in the SOT-MRAM array with overlying layers removed and includes cells 15-1 and 15-2 described previously, and cells 15-3 and 15-4 in a second row where cell 15-3 contacts BE 10a1 and BE 10b1, and cell 15-4 contacts BE 10b1 and BE 10c1. The cross-sectional view in FIG. 13 is taken at plane 30-30 in FIG. 14. Note when SOT-MRAM 15-1 is a square or rectangular shape, sides 15s are each aligned in the x-axis direction and have a length d, and are separated by two sides 15s' having the width w3 that are aligned in the y-axis direction. For an oval or circular SOT-MRAM device, there is a single continuously curved side 15s (not shown).

Figure 15:
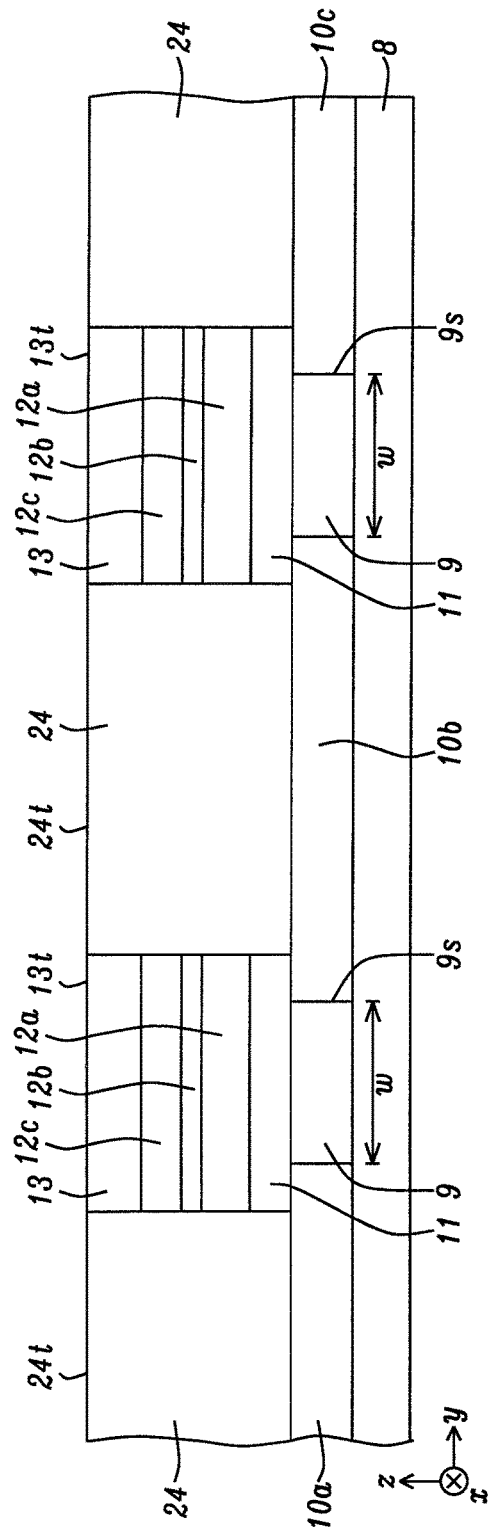
FIG. 15 is a cross-sectional view of the SOT-MRAM array in FIG. 13 after an encapsulation layer is deposited to fill the gaps between adjacent SOT-MRAM cells.

Referring to FIG. 15, the partially formed SOT-MRAM structure in FIG. 13 is shown after an encapsulation layer 24 is deposited to fill openings between adjacent SOT-MRAM cells 15-1, 15-2, and other cells (not shown). The encapsulation layer is an insulation material, and also protects the SOT-MRAM layers from moisture and oxygen, and may comprise two or more sub-layers. A chemical mechanical polish (CMP) process may be employed to form a top surface 24t on the encapsulation layer that is coplanar with HM top surface 13t.

Figure 16:
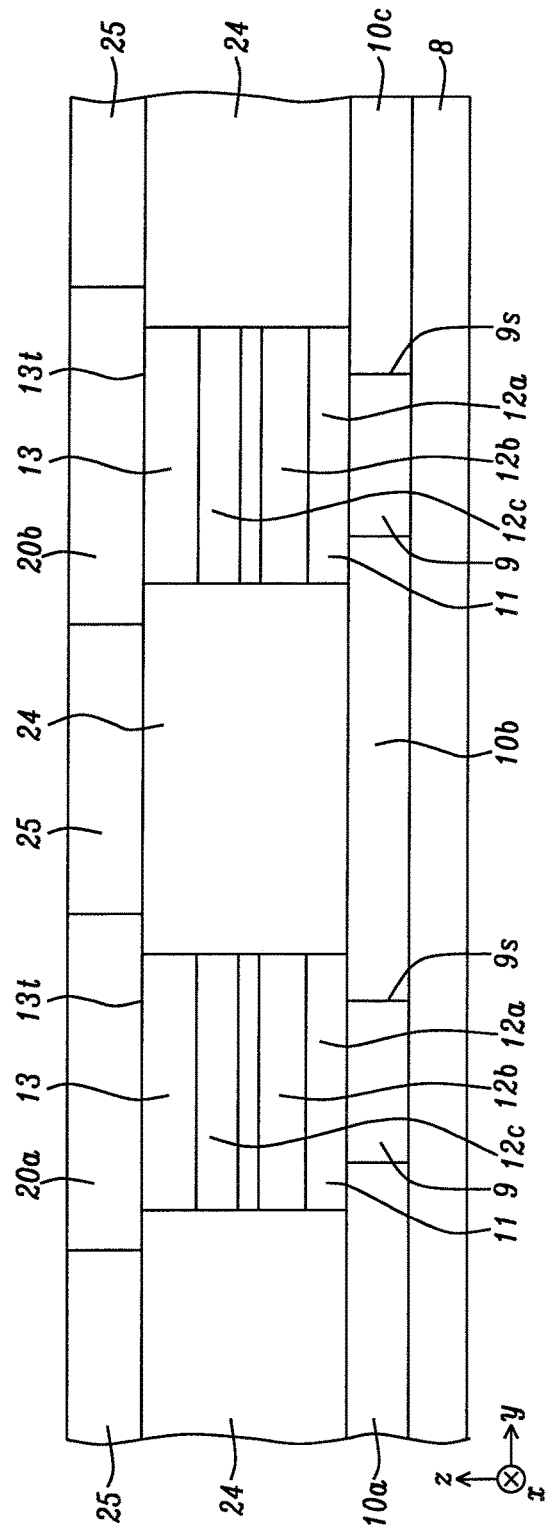
FIG. 16 is a cross-sectional view depicting the SOT-MRAM array in FIG. 15 after a top electrode is formed on each SOT-MRAM cell.

Thereafter, as shown in FIG. 16, a top electrode (TE) is formed above each SOT-MRAM, and within an insulation layer 25 using a conventional method. Thus, the TE array includes TE 20a that is formed above SOT-MRAM cell 15-1, and TE 20b that is formed above cell 15-2. In some embodiments, TE 20a and TE 20b may be comprised of the same conductive material as in BE 10a and BE 10b.

Referring to FIG. 17, during a write operation involving SOT-MRAM cell 15-1, for example, where magnetization 12m1 in FL 12a is to be flipped from a downward direction to an upward direction, current $I_w$ is applied from BE 10a to BE 10b and across SHE layer 11 in a first in-plane (+y axis) direction. Conduction electrons in $I_w$ that carry spin downward propagate to the SHE layer bottom surface 11b and conduction electrons with upward spin propagate to the SHE layer top surface 11t. The spin angular momentum of the upward spin current generates transverse spin transfer torque 19t, which opposes FL magnetization 12m1. When the transverse spin transfer torque is sufficiently large, FM magnetization switches to the opposite direction and becomes parallel to RL magnetization 12m2. In an alternative embodiment (not shown) when switching FL magnetization 12m1 in SOT-MRAM cell 15-1 from an upward direction that is parallel to RL magnetization 12m2 to a downward (antiparallel) direction, $I_w$ is applied from BE 10b to BE 10a and across the SHE layer in a second in-plane (−y axis) direction. In this case, conduction electrons with downward spin propagate to the SHE layer top surface. The aforementioned $I_w$ pathways apply when the SHE layer is made of a positive SHA material. In embodiments where the SHE layer is a negative SHA material, the $I_w$ pathway in FIG. 17 is in the reverse direction to flip FL magnetization 12m1 from a downward direction to an upward direction.

Referring to FIG. 18, a read operation is illustrated for SOT-MRAM cell 15-1 where a read current $I_r$ is directed from TE 20a through HM 13, RL 12c, tunnel barrier 12b, FL 12a, SHE layer 11, and into BE 10a or BE 10b. Alternatively, the read current may flow from BE 10a or BE 10b to TE 20a. Thus, a third terminal that is a TE is used for a read operation unlike the write operation where the two terminals are both bottom electrodes. Accordingly, there is significantly less risk in SOT-MRAM that a read current will inadvertently switch a FM layer magnetization than in STT-MRAM where both of the read and write operations require applying a current between a top electrode and a bottom electrode. As a result, there is improved device reliability in that FM magnetization is more stable (greater retention time) in the SOT-MRAM structure disclosed herein. Moreover, fewer process steps are necessary to fabricate the device than in the POR scheme where the SHE layer and FM layer are patterned in separate photoimaging and etching sequences.

Figure 10:
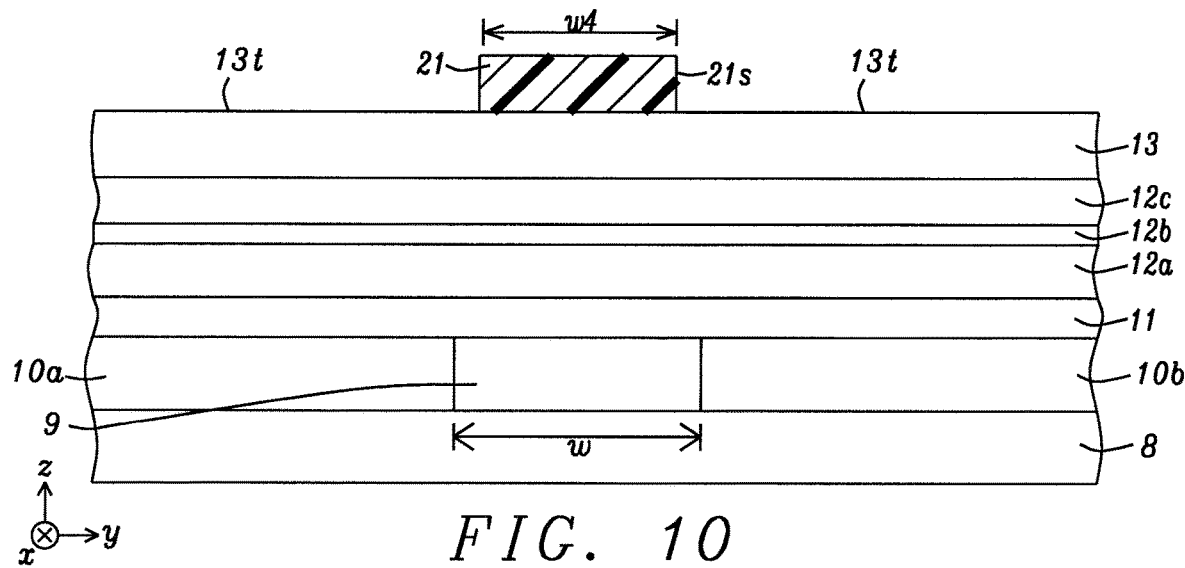
FIGS. 10-12 are cross-sectional views showing a sequence in forming a three terminal SOT switching device where a SHE layer/FM layer stack is etched in a single process, and the FM layer width is less than the width of the underlying dielectric spacer according to a second embodiment of the present disclosure.
Figure 11:
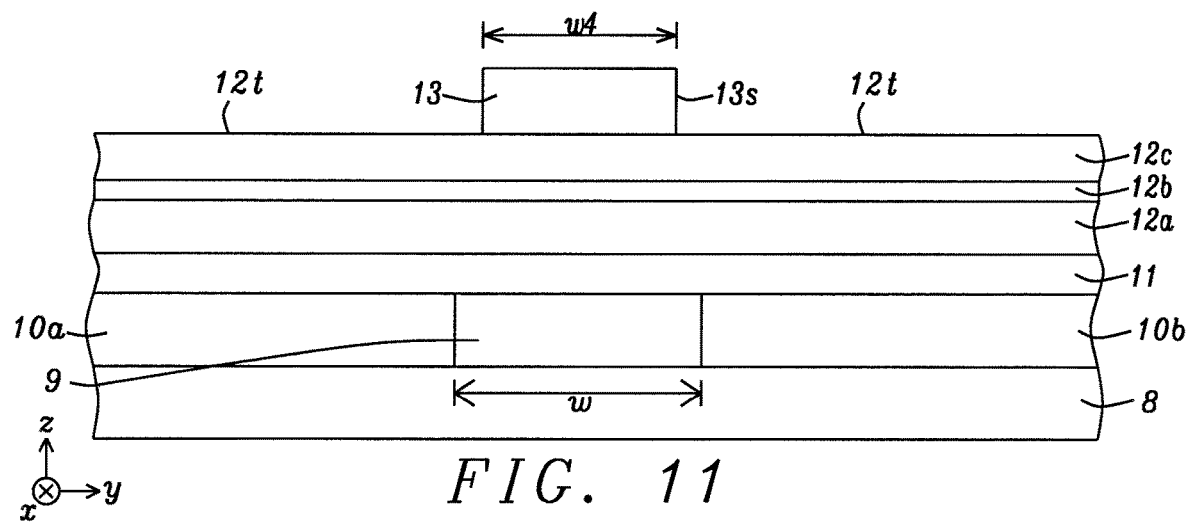
Figure 12:
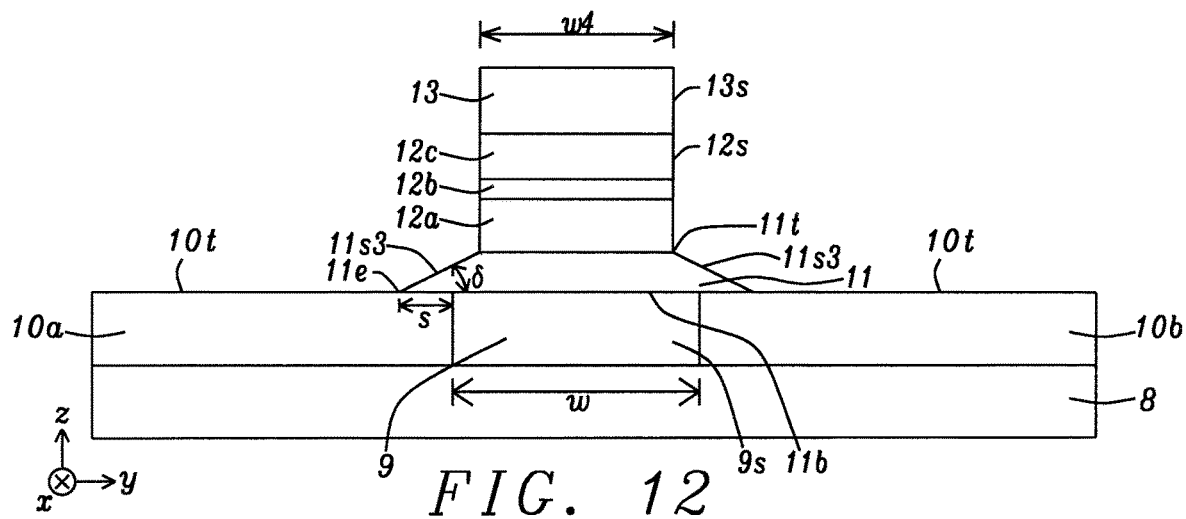

According to an alternative embodiment depicted in FIGS. 10-12, the SOT-MRAM 15-1 in FIG. 12 that is formed by a process of the present disclosure may have a width w4 in the HM layer 13, RL 12c, tunnel barrier 12b, FL 12a that is less than the width w of the dielectric spacer 9 between BE 10a and BE 10b. Furthermore, the SHE layer 11 has tapered sides 11s3 such that a top surface 11t thereof has width w4 but a bottom surface thereof has a width substantially greater than w. Preferably, an outer portion of the SHE layer below each side 11s3 overlays on a top surface of each of BE 10a and BE 10b that is proximate to dielectric spacer side 9s. In other words, a bottom end 11e of each SHE layer side has a minimum width s from dielectric spacer side 9s where s is from 5 nm to 10 nm. In this embodiment, each SHE layer side is not coplanar with an overlying FL side 12s.

Referring to FIG. 10, all of the layers and features in the partially formed SOT-MRAM structure in FIG. 7 are retained except photoresist mask 20 is replaced with photoresist mask 21 having an island shape of width w4 and sides 21s. As indicated previously, the photoresist mask pattern is an array of a plurality of island shapes arranged in rows and columns but only one island shape is shown in the exemplary embodiment in order to simply the drawing.

In FIG. 11, the island shape in the photoresist mask is transferred through the HM layer 13 by using an IBE or RIE process described previously with respect to FIG. 8 to generate HM side 13s and a HM island shape of width w4. A conventional process is then used to remove any remaining photoresist mask.

Referring to FIG. 12, another etch process is employed to form sides on the remaining layers in the STO-MRAM stack including RL 12c, tunnel barrier 12b, FL 12a and SHE layer 11, and comprises two steps that are preferably performed in the same process chamber. According to one embodiment, one step is an RIE or IBE comprised of an inert gas and oxidant described previously in the first embodiment that forms sides 12s. Thereafter, an IBE with an angled beam is employed to form SHE layer sides 11s3 with a taper angle δ from 20 degrees to 70 degrees with respect to top surface 10t of BE 10a and BE 10b. In some embodiments, the IBE tool has a radio frequency (RF) inductively coupled plasma (ICP) ion source. The angled IBE to etch the SHE layer may include a first portion using a high RF power from 300 Watts to 1000 Watts, and a final portion with a relatively low power less than 100 Watts to produce the aforementioned taper angle.

The SOT-M RAM is completed with a process that involves the same sequence of steps described earlier with regard to FIGS. 15-16.

The same benefits and advantages associated with the first embodiment are also realized with the second embodiment. In particular, fewer process steps are required than in the POR scheme. Also, greater device reliability is expected because the etch process through the FM layer and non-magnetic SHE layer is more reproducible and provides adequate overlap of the SHE layer on both of the adjacent BE to enable a consistent write current pathway.

While the present disclosure has been particularly shown and described with reference to, the preferred embodiments thereof, it will be understood by those skilled in the art that various changes in form and details may be made without departing from the spirit and scope of this disclosure.

We claim:

1. A three terminal spin-orbit-torque (SOT) switching device, comprising:
   (a) first and second bottom electrodes (BE) that adjoin opposing sidewalls of a dielectric spacer wherein the opposing dielectric spacer sidewalls are separated by a first width (w) along a first axis, and wherein each of the first and second BE have a top surface that is coplanar with a dielectric spacer top surface;
   (b) a stack of layers wherein each layer has substantially a second width (w3) along the first axis wherein w3>w, and is the distance between two opposing planar sidewalls aligned parallel to a second axis, and each layer has substantially a first length (d) along the second axis that is orthogonal to the first axis and wherein d is the distance between two opposing planar sidewalls aligned parallel to the first axis, comprising:
   (1) a non-magnetic Spin Hall Effect (SHE) layer that adjoins the dielectric spacer top surface and comprised of a Spin Hall Angle (SHA) material, and wherein a bottom end of a first side of the SHE layer contacts the top surface of the first BE and a bottom end of a second side of the SHE layer contacts the top surface of the second BE, and the SHE layer is configured to generate a spin-orbit-torque on an overlying ferromagnetic (FM) layer when a first current is applied across the SHE layer in a first axis direction from the first BE to the second BE, or in a direction opposite to the first axis direction;
   (2) the overlying FM layer having a magnetization in a perpendicular-to-plane direction that flips to an opposite direction when the spin-orbit-torque is generated by the SHE layer; and
   (3) an uppermost hard mask (HM) layer with a top surface that is formed above the FM layer; and
   (c) a top electrode (TE) formed on the HM layer top surface, and configured so that a read operation that determines the magnetization direction in the FM layer is performed when a second current is applied from the TE to one of the first BE and second BE, or from one of the first and second BE to the TE.

2. The three terminal SOT switching device of claim 1 wherein the SHE layer has a thickness less than 12 nm.

3. The three terminal SOT switching device of claim 1 wherein the SHE layer is made of a positive SHA material and said three terminal SOT switching device is configured to apply the first current across the SHE layer in the first axis (in-plane) direction when switching the FM layer magnetization from an upward direction toward the TE to a downward direction, and to apply the first current across the SHE layer in a direction opposite to the first axis direction when switching the FM layer magnetization from the downward direction to the upward direction.

4. The three terminal SOT switching device of claim 1 wherein the SHE layer is made of a negative SHA material and said three terminal SOT switching device is configured to apply the first current across the SHE layer in the first axis (in-plane) direction when switching the FM layer magnetization from a downward direction to an upward direction toward the TE, and to apply the first current across the SHE layer in a direction opposite to the first axis direction when switching the FM layer magnetization from the upward direction to the downward direction.

5. The three terminal SOT switching device of claim 1 wherein the SHE layer is one of Ta, Hf, Pt, Ir, and W, or is a topological insulator (TI) that is $Bi_2Sb_3$, $Bi_2Se_3$, $Bi_2Te_3$, or $Sb_2Te_3$.

6. The three terminal SOT switching device of claim 1 wherein the FM layer is one or more of Co, Fe, Ni, or alloys thereof with B, or laminates thereof including $(Co/Ni)_n$, $(CoFe/Ni)_n$, or laminates with Pt or Pd that are $(Fe/Pt)_n$, $(Co/Pt)_n$, $(Fe/Pd)_n$, and $(Co/Pd)_n$ where n is a lamination number.

7. The three terminal SOT switching device of claim 1 wherein the FM layer is a free layer (FL), and the stack of layers is further comprised of a tunnel barrier on the FL, and a reference layer having a fixed magnetization in the perpendicular-to-plane direction that is formed on the tunnel barrier layer.

8. The three terminal SOT switching device of claim 1 wherein the second width is greater than the first width, and each of the first and second sides of the SHE layer is coplanar with a side of the FM layer and HM layer.

9. The three terminal SOT switching device of claim 1 wherein the second width is greater than the first width.

10. The three terminal SOT switching device of claim 9 wherein each of the first and second SHE layer sides forms an angle from 20 degrees to 70 degrees with a top surface of the first BE and second BE, respectively.

11. The three terminal SOT switching device of claim 1 wherein the bottom ends of the first and second sides of the SHE layer are each a distance of at least 5 nm to 10 nm from one of the opposing dielectric spacer sidewalls in the first axis direction.

12. The three terminal SOT switching device of claim 1 wherein the first width is from 30 nm to 300 nm.

* * * * *